(12) United States Patent
Cheng et al.

(10) Patent No.: US 8,053,797 B2
(45) Date of Patent: Nov. 8, 2011

(54) LIGHT-EMITTING DEVICE WITH REFLECTION LAYER AND STRUCTURE OF THE REFLECTION LAYER

(75) Inventors: Wei-Kang Cheng, Taoyuan (TW);
Shyi-Ming Pan, Taoyuan (TW);
Cheng-Kuo Huang, Taoyuan (TW);
Yin-Cheng Chu, Taoyuan (TW);
Kuo-Chin Huang, Taoyuan (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 319 days.

(21) Appl. No.: 12/234,652

(22) Filed: Sep. 20, 2008

(65) Prior Publication Data
US 2009/0267095 A1 Oct. 29, 2009

(30) Foreign Application Priority Data

Apr. 25, 2008 (TW) .............................. 97115464 A

(51) Int. Cl.
*H01L 33/00* (2010.01)
(52) U.S. Cl. ............ 257/98; 257/E33.068; 257/E33.072
(58) Field of Classification Search .................... 257/98, 257/E33.068, E33.072
See application file for complete search history.

(56) References Cited

U.S. PATENT DOCUMENTS

| 5,813,753 | A  | * | 9/1998  | Vriens et al. | ................... 362/293 |
| 6,155,699 | A  | * | 12/2000 | Miller et al. | ................... 362/293 |
| 7,148,514 | B2 | * | 12/2006 | Seo et al.    | ........................ 257/79 |
| 2004/0252509 | A1 | * | 12/2004 | Lin        | ................ 362/293 |

* cited by examiner

*Primary Examiner* — David S Blum
(74) *Attorney, Agent, or Firm* — Ming Chow; Sinorica, LLC

(57) ABSTRACT

The present invention provides a light-emitting device with a reflection layer and the structure of the reflection layer. The reflection layer comprises a variety of dielectric materials. The reflection layer includes a plurality of dielectric layers. The materials of the plurality of dielectric layers have two or more types with two or more thicknesses, except for the combination of two material types and two thicknesses, for forming the reflection layer with a variety of structures. The reflection layer according to the present invention can be applied to light-emitting diodes of various types to form new light-emitting devices. Owing to its excellent reflectivity, the reflection layer can improve light-emitting efficiency of the light-emitting devices.

10 Claims, 10 Drawing Sheets

LIGHT-EMITTING DEVICE WITH REFLECTION LAYER AND STRUCTURE OF THE REFLECTION LAYER

FIELD OF THE INVENTION

The present invention relates generally to a light-emitting device, and particularly to a light-emitting device with a reflection layer having excellent reflectivity.

BACKGROUND OF THE INVENTION

Light-emitting diodes (LEDs) are light-emitting devices manufactured in semiconductor materials. The devices have two electrodes. When a voltage is applied across the terminals, a small current will flow and the recombination of electrons and holes will release excess energy in the form of stimulated light. This is the fundamental light-emitting principle of LEDs. LEDs are different from general incandescent bulbs. They are luminescent, having the advantages of low power consumption, extended lifetime, no warm-up time, and fast response time. In addition, they are small in size, vibration enduring, and suitable for mass production, and they can be manufactured into an ultra small device or arranged in a matrix form. Currently, LEDs are popular in indicators and display devices of information, communication, and consumer electronic products, and have become indispensable devices of daily lives.

In order to enhance light-emitting efficiency of LEDs, nowadays, a reflection layer is set in the structure of LEDs for reflecting the light energy emitted by the LEDs and reducing energy loss. The materials of the reflection layer according to the prior art are mostly metallic materials. However, the reflectivity of the reflection layer using the metallic materials are inferior, causing the reflected light energy be absorbed by other material layers of the LEDs without enhancing light-emitting efficiency thereof. Besides, inter-diffusion phenomenon occurs between the reflection layer and other metal layers.

To solve the problems described above, a reflection layer comprised by a metallic material and a dielectric material is developed. However, the reflection layer can only improve the inter-diffusion phenomenon between the reflection layer and other metal layers. The reflectivity thereof is not enhanced. Hence, improvements in light-emitting efficiency are still limited.

Accordingly, the present invention provides a structure of reflection layer containing no metallic materials. The reflection layer can be applied to LEDs of various types, and can improve the light-emitting efficiency of LEDs.

SUMMARY

An objective of the present invention is to provide a light-emitting device with a reflection layer and the structure of the reflection layer. The reflection layer provides excellent reflectivity, enhancing effectively the light-emitting efficiency of the light-emitting device.

Another objective of the present invention is to provide a light-emitting device with a reflection layer and the structure of the reflection layer. The reflection layer comprises a plurality of dielectric materials and contains no metallic materials. Thereby, inter-diffusion phenomenon with other metal layers will not occur.

To achieve the objectives described above, the present invention provides a light-emitting device with a reflection layer and the structure of the reflection layer. The reflection layer comprises a plurality of dielectric materials. The plurality of dielectric materials has two or more types and has two or more thicknesses for producing a variety of combinations, and thus producing reflection layers with a variety of structures, except for the combinations with two types of dielectric materials with two thicknesses. The reflection layer can be applied to a vertical LED or a flip-chip LED to form a light-emitting device with a reflection layer.

DETAILED DESCRIPTION

In order to make the structure and characteristics as well as the effectiveness of the present invention to be further understood and recognized, the detailed description of the present invention is provided as follows along with preferred embodiments and accompanying figures.

Figure 1:
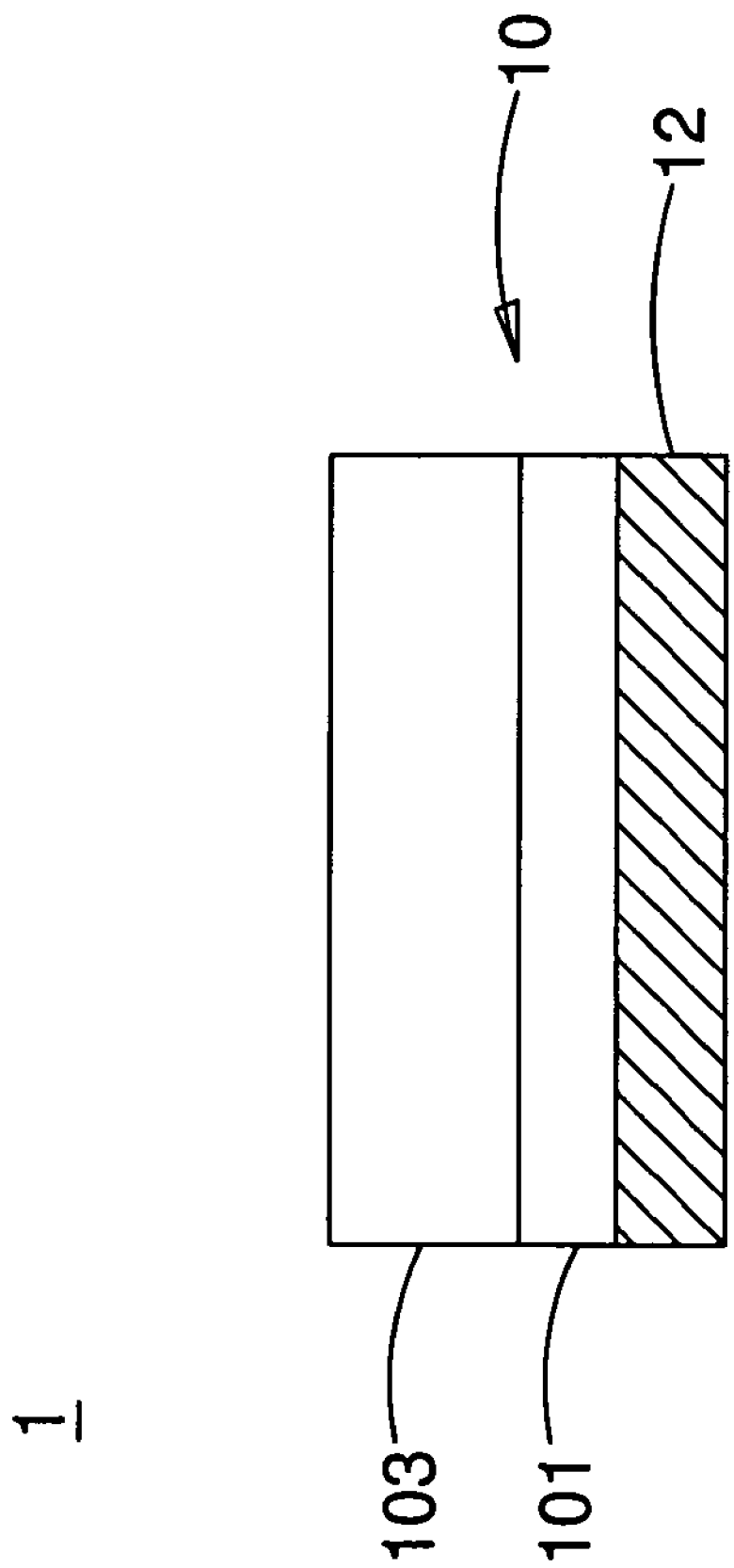
FIG. 1 shows a structural schematic diagram of the light-emitting device according to a preferred embodiment of the present invention.

FIG. 1 shows a structural schematic diagram of the light-emitting device according to a preferred embodiment of the present invention. As shown in the figure, the present preferred embodiment provides a light-emitting device 1, which comprises a light-emitting diode (LED) 10 and a reflection layer 12. The LED 10 includes a substrate 101 and an epitaxial structure 103. The epitaxial structure 103 is set on the substrate 101. The reflection layer 12 can be set according to the light-emitting direction of the LED 10. According to the present preferred embodiment, the reflection layer 12 is set on the substrate 101 of the LED 10 and is opposite to the epitaxial structure 103.

The light-emitting device 1 according to the present preferred embodiment is characterized in that the reflection layer 12 is comprised of a variety of dielectric materials and contains no metallic materials. The reflectivity of a reflection layer formed by metallic materials according to the prior art is not high. Thereby, according to the present preferred embodiment, a variety of dielectric materials are adopted to form the reflection layer 12. Hence, the problem of low reflectivity appeared in the reflection layer formed by metallic material according to the prior art can be improved. Consequently, light energy reflected by the reflection layer 12 is prevented from being absorbed by other materials of the LED 10.

In order to increase reflectivity of the reflection layer 12, the transmittivity of the reflection layer 12 has to be less than 20%, and the thickness thereof has to be kept between 3000 Å and 500000 Å. The reflection layer 12 comprises a plurality of dielectric layers. The materials of the plurality of dielectric layers have two or more types and have three or more thicknesses. Alternatively, the materials of the plurality of dielectric layers have three or more types and have two or more thicknesses. According to the conditions above, various reflection layers 12 with different structures can be formed. Thereby, the reflection layer 12 can reflect light with various wavelengths and has high reflectivity. Accordingly, light-emitting efficiency of the light-emitting device can be enhanced. The structure of the reflection layer 12 will be described in the following preferred embodiment.

Figure 2:
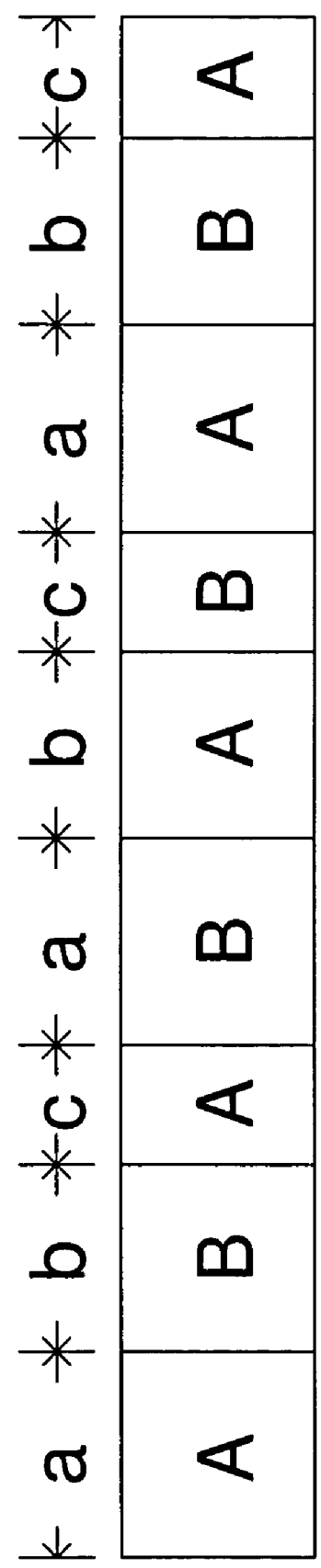
FIG. 2 shows a structural schematic diagram of the reflection layer according to another preferred embodiment of the present invention.

FIG. 2 shows a structural schematic diagram of the reflection layer according to another preferred embodiment of the present invention. As shown in the figure, similarly to the preferred embodiment of FIG. 1, the reflection layer 12 comprises a variety of dielectric materials. The reflection layer 12 according to the present preferred embodiment includes the plurality of dielectric layers. The materials of the plurality of dielectric layers have two types. Thereby, the plurality of dielectric layers includes a plurality of first dielectric layer A and a plurality of second dielectric layer B. In addition, the types of the materials of two adjacent dielectric layers have to be different. Hence, the plurality of first dielectric layers and the plurality of second dielectric layers are set interlacedly. The material of the dielectric layer is selected from one or more of the group comprising silicon oxide, titanium oxide, zinc oxide, niobium oxide, tantalum oxide, aluminum oxide, indium oxide, magnesium oxide, tin oxide, or from one or more of the group comprising silicon nitride, titanium nitride, zinc nitride, niobium nitride, tantalum nitride, aluminum nitride, indium nitride, magnesium nitride, tin nitride. Besides, the plurality of dielectric layers has three thicknesses, including a, b, and c, respectively. The arrangement of the thicknesses is shown in FIG. 2. The arrangement of the plurality of dielectric layers can be regular or irregular. According to the present preferred embodiment, the arrangement of the plurality of dielectric layers is regular. The thicknesses of the first dielectric layer A and the second dielectric layer are not fixed values (a, b, or c). However, they have to be selected from one of the three thicknesses. The difference between the reflection layer 12 formed according to the conditions described above and the reflection layer formed by two dielectric materials according to the prior art is that, the reflection layer according to the prior art is formed by two dielectric materials with fixed thicknesses for each of the dielectric materials. On the contrary, the thickness of the material of each of the dielectric layers is not fixed according to the present preferred embodiment. Accordingly, the reflectivity of the reflection layer 12 according to the present preferred embodiment is superior to that of the reflection layer according to the prior art. Moreover, according to the present preferred embodiment, a wide spectrum of light can be reflected, enhancing the light-emitting efficiency of the light-emitting device 1.

Figure 3:
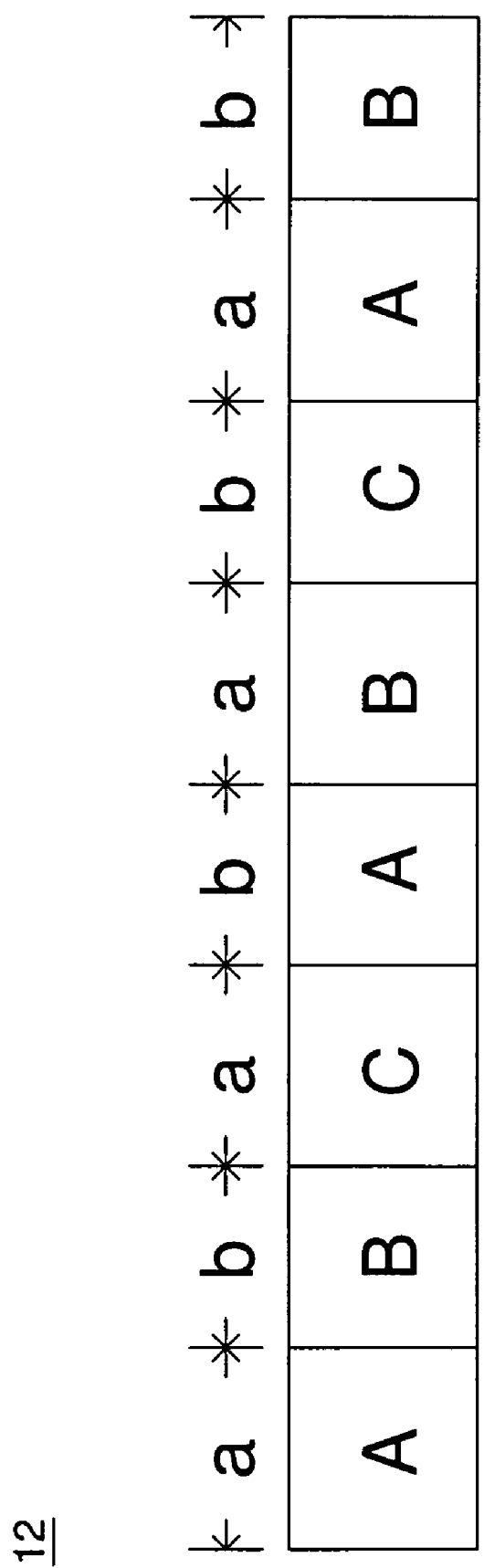
FIG. 3 shows a structural schematic diagram of the reflection layer according to another preferred embodiment of the present invention.

FIG. 3 shows a structural schematic diagram of the reflection layer according to another preferred embodiment of the present invention. As shown in the figure, the present preferred embodiment provides another structure of the reflection layer. The difference between the present preferred embodiment and the one according to FIG. 2 is that, the reflection layers 12 according to the present preferred embodiment comprises three types of dielectric materials. The reflection layer 12 includes the plurality of dielectric layers. The plurality of dielectric layers comprises a plurality of first dielectric layers A, a plurality of second dielectric layers B, and a plurality of third dielectric layers C. The materials of two adjacent dielectric layers of the plurality of dielectric layers have to be different. Thereby, the first, second, and third dielectric layers A, B, C can be arranged in order and repeatedly. The plurality of the first, second, and third dielectric layers A, B, C according to the present preferred embodiment is arranged regularly. However, the plurality of the first, second, and third dielectric layers A, B, C can be arranged irregularly as well.

The plurality of dielectric layers has two thicknesses, including a and b. The arrangement is shown in FIG. 3, and is one of many arrangements. The arrangement of the thicknesses of the plurality of dielectric layers can be regular or irregular. According to the present preferred embodiment, the arrangement of the thicknesses of the plurality of dielectric layers is regular. The thicknesses of the first, second, and third dielectric layers A, B, C need not be a fixed value, but have to be one of the two thicknesses. Besides, the thicknesses of two adjacent dielectric layers have to be different. The reflection layer 12 formed according to the conditions described above can reflect a wide spectrum of light. It also has high reflectivity. Thereby, the light-emitting efficiency of the light-emitting device can be improved.

Figure 4:
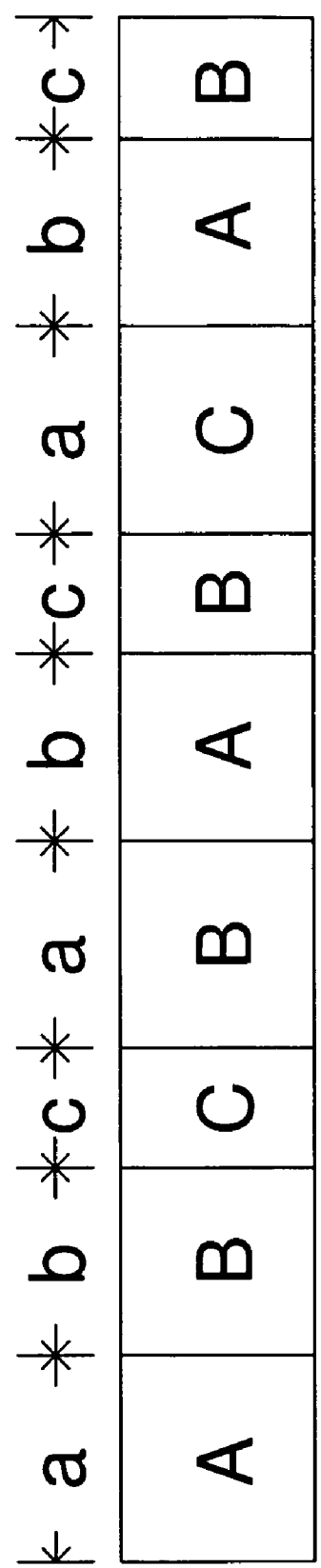
FIG. 4 shows a structural schematic diagram of the reflection layer according to another preferred embodiment of the present invention.

FIG. 4 shows a structural schematic diagram of the reflection layer according to another preferred embodiment of the present invention. As shown in the figure, the present preferred embodiment provides a structure of the reflection layer. The reflection layer 12, similar to the preferred embodiment in FIG. 3, comprises three dielectric materials and includes the plurality of dielectric layers. The plurality of dielectric layers includes the plurality of first dielectric layers A, the plurality of second dielectric layers B, and the plurality of third dielectric layers C. The plurality of the first, second, and third dielectric layers A, B, C according to the present preferred embodiment is arranged irregularly. In addition, the materials of two adjacent dielectric layers of the plurality of dielectric layers have to be different.

The plurality of dielectric layers has three thicknesses, including a, b, and c, and the arrangement of the thicknesses is irregular (refer to FIG. 4). Besides, the thicknesses of two adjacent dielectric layers have to be different. The thicknesses of the first, second, and third dielectric layers A, B, C are one of the three thicknesses. The reflection layer 12 formed according to the conditions described above can reflect a wide spectrum of light. It also has high reflectivity. Thereby, the light-emitting efficiency of the light-emitting device can be improved.

FIGS. 2, 3, and 4 disclose the structures of the reflection layer. In addition to the structure disclosed in the preferred embodiments described above, the reflection layer includes the plurality of dielectric layers, and satisfies the conditions of two or more types of materials as well as two or more thicknesses except for the combination of two types of materials and two thicknesses. Thereby, a reflection layer 12 with high reflectivity is acquired.

Figure 5:
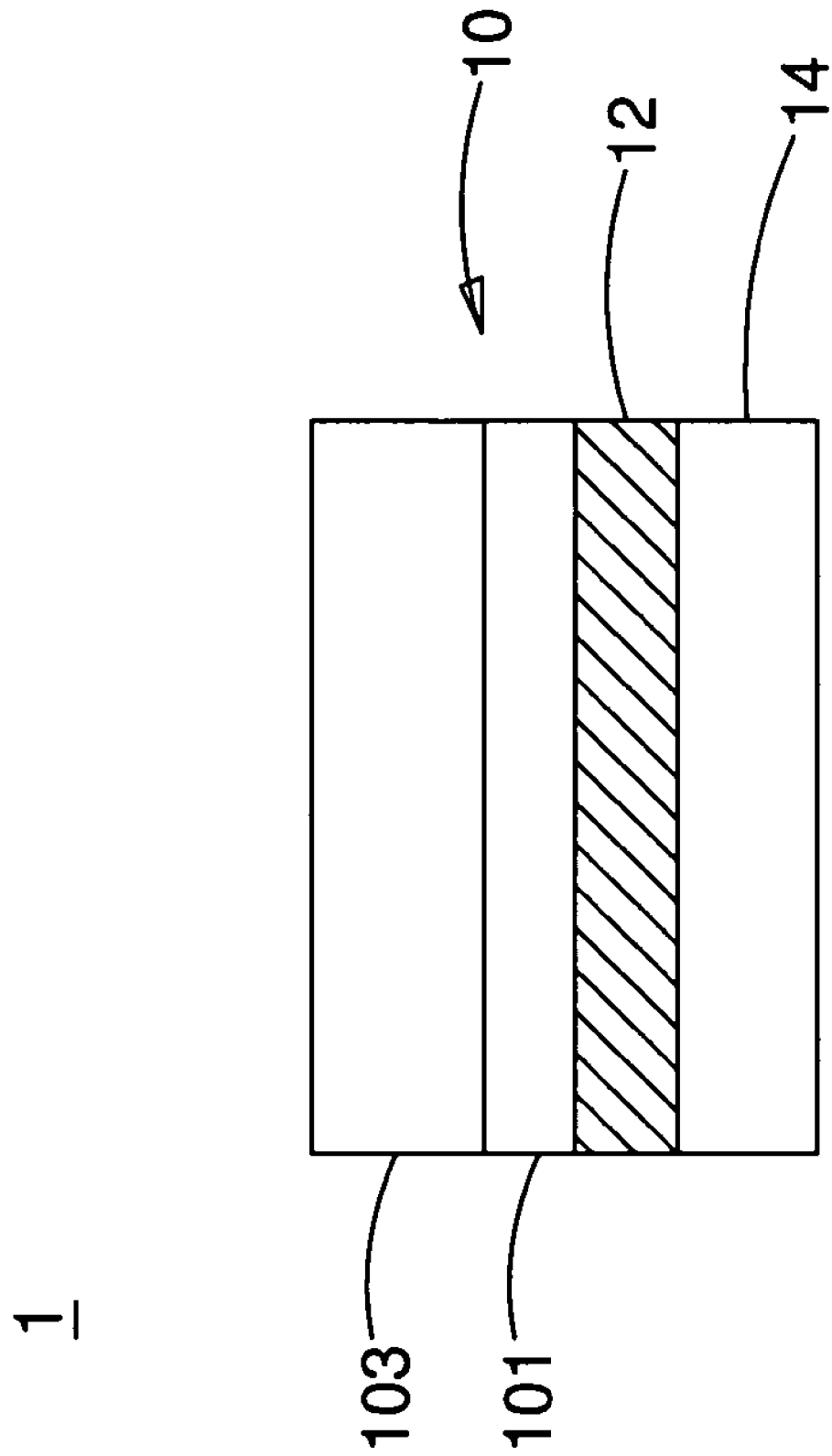
FIG. 5 shows a structural schematic diagram of the light-emitting device according to another preferred embodiment of the present invention.

FIG. 5 shows a structural schematic diagram of the light-emitting device according to another preferred embodiment of the present invention. As shown in the figure, the present preferred embodiment provides a light-emitting device 1, which comprises a light-emitting diode (LED) 10, a reflection layer 12, and a heat transfer layer 14. The LED 10 includes a substrate 101 and an epitaxial structure 103. The epitaxial structure 103 is set on the substrate 101. The reflection layer 12 is set on the reflection layer 12, and is opposite to the epitaxial structure 103. The heat transfer layer 14 is set on the reflection layer 12, and is opposite to the substrate 101. The structure of the reflection layer 12 is described in the preferred embodiments of FIGS. 2, 3, and 4. The reflection layer 12 comprises the plurality of dielectric layers, and satisfies the conditions of two or more types of materials as well as two or more thicknesses. Besides, the transmittivity of the reflection layer 12 has to be less than 20%, and the thickness thereof has to be kept between 3000 Å and 500000 Å. The material of the heat-conducting layer 14 is a metallic alloy with a high heat transfer coefficient, such as gold-tin alloy and copper-tungsten alloy. Because the reflection layer 12 of the light-emitting device 1 according to the present preferred embodiment is formed by the plurality of dielectric materials, the inter-diffusion phenomenon between the metallic materials in the reflection layer 12 and the metallic alloys in the heat transfer layer 14 according to the prior art.

Figure 6:
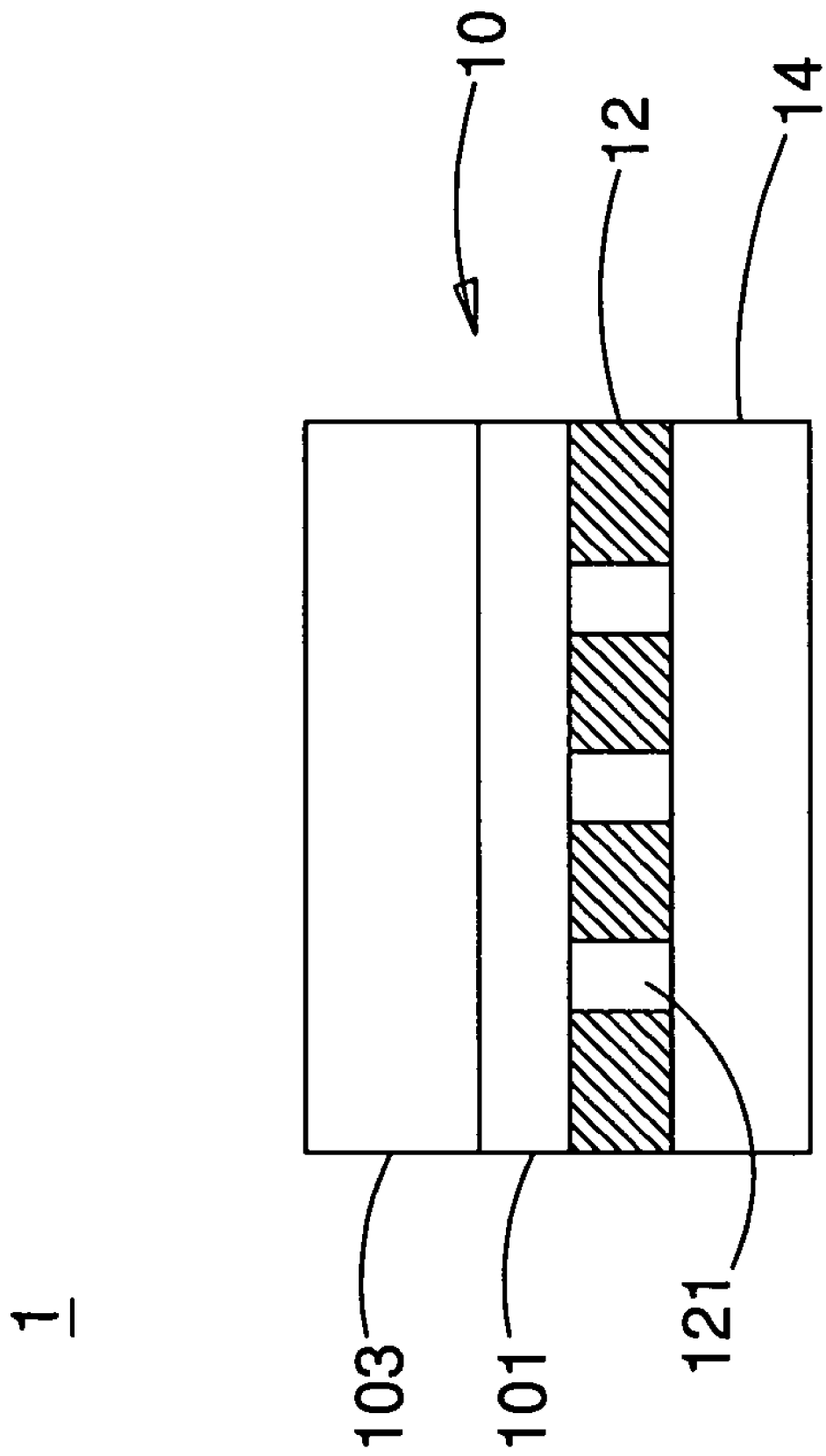
FIG. 6 shows a structural schematic diagram of the light-emitting device according to another preferred embodiment of the present invention.

FIG. 6 shows a structural schematic diagram of the light-emitting device according to another preferred embodiment of the present invention. As shown in the figure, the reflection layer 12 further has a plurality of heat transfer channels 121. The heat produced by the LED 10 can be sunk to the heat transfer layer 14 through the plurality of heat transfer channels 121. Thereby, the heat-sinking effect can be improved.

Figure 7:
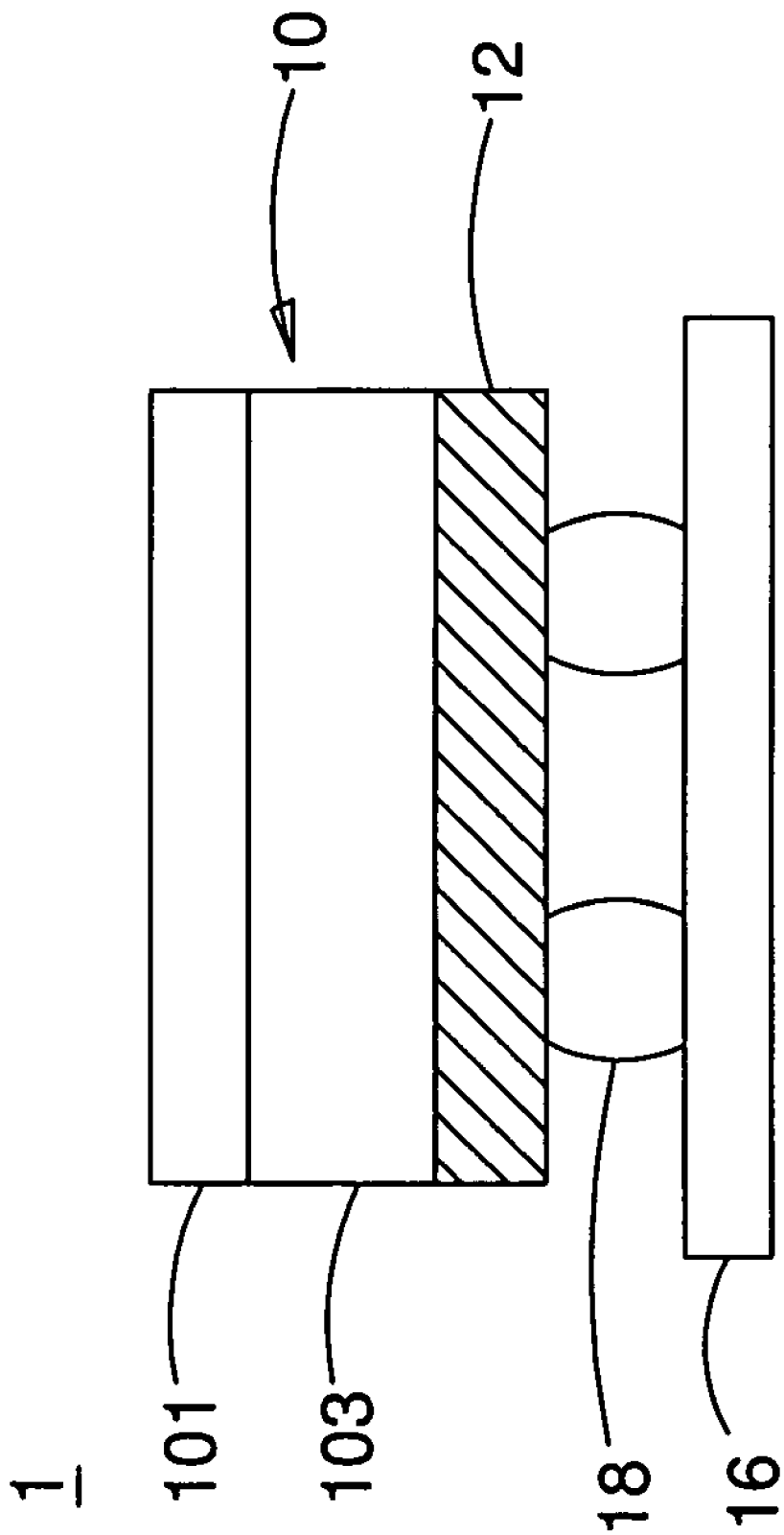
FIG. 7 shows a structural schematic diagram of the light-emitting device according to another preferred embodiment of the present invention.

FIG. 7 shows a structural schematic diagram of the light-emitting device according to another preferred embodiment of the present invention. As shown in the figure, the present preferred embodiment provides a light-emitting device 1, which comprises a light-emitting diode (LED) 10, a reflection layer 12, and a platform 16. The LED 10 includes a substrate 101 and an epitaxial structure 103. The epitaxial structure 103 is set on the substrate 101. The reflection layer 12 is set on the epitaxial structure 103, and is opposite to the substrate 101. The platform 16 uses a plurality of metallic bumps 18 to connect to the epitaxial structure 103 with the reflection layer 12. Besides, the transmittivity of the reflection layer 12 has to be less than 20%, and the thickness thereof has to be kept between 3000 Å and 500000 Å. The reflection layer 12 includes a plurality of dielectric layers, and satisfies the conditions of two or more types of materials as well as two or more thicknesses except for the combination of two types of materials and two thicknesses. According to the reflection layer 12 described above, a wide spectrum of light can be reflected and high reflectivity is acquired, thus enhancing the light-emitting efficiency of the light-emitting device 1.

Figure 8:
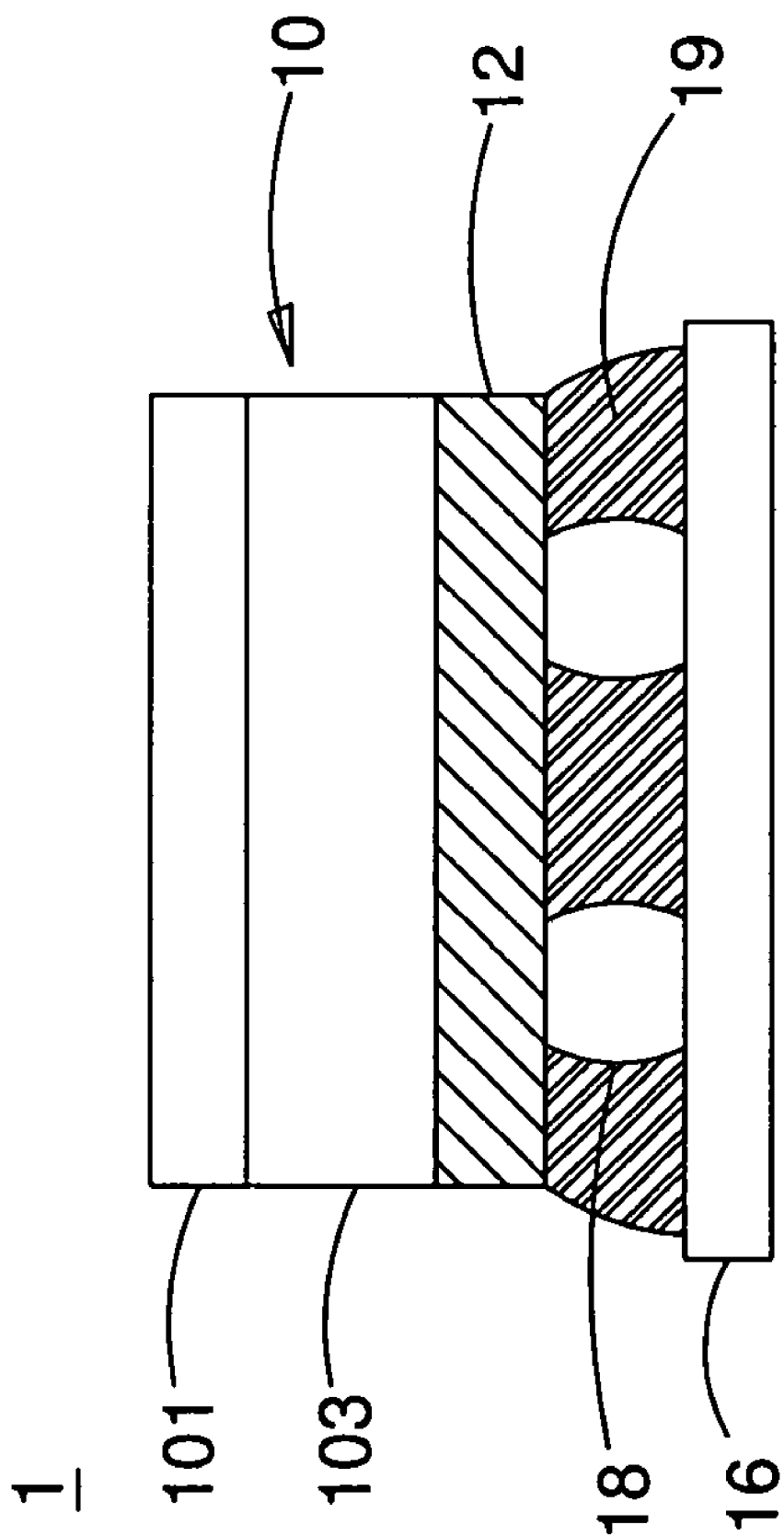
FIG. 8 shows a structural schematic diagram of the light-emitting device according to another preferred embodiment of the present invention.

FIG. 8 shows a structural schematic diagram of the light-emitting device according to another preferred embodiment of the present invention. As shown in the figure, the difference between the present preferred embodiment and the one in FIG. 7 is that, according to the present preferred embodiment, a supporting layer 19 is set between the platform 16 and the epitaxial structure 103 with the reflection layer 12 for supporting the LED 10 with the reflection layer 12. The material of the supporting layer 19 is organic polymers.

Figure 9:
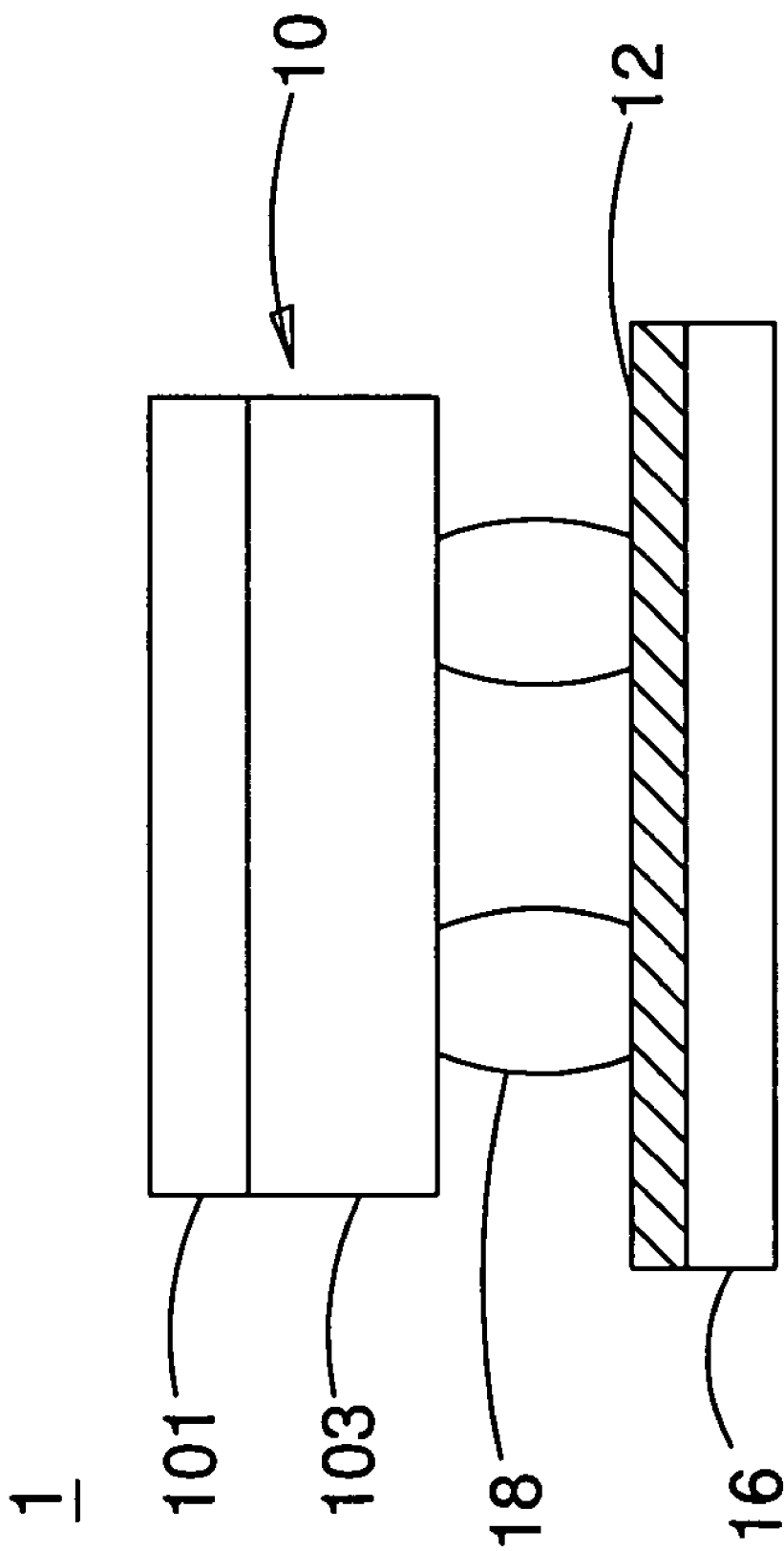
FIG. 9 shows a structural schematic diagram of the light-emitting device according to another preferred embodiment of the present invention.

FIG. 9 shows a structural schematic diagram of the light-emitting device according to another preferred embodiment of the present invention. As shown in the figure, the present preferred embodiment provides a light-emitting device 1, comprising a light-emitting diode (LED) 10, a platform 16, and a reflection layer 12. The LED 10 comprises a substrate 101 and an epitaxial structure 103. The epitaxial structure 103 is set on the substrate 101. The platform 16 is set on one side of the epitaxial structure 103. The difference between the present preferred embodiment and the one in FIG. 9 is that, according to the present preferred embodiment, the reflection layer 12 is set on the platform 16. The platform 16 with the reflection layer 12 uses a plurality of metallic bumps 18 to connect to the epitaxial structure 103. The light-emitting device 1 according to the present preferred embodiment enhances the overall light-emitting efficiency by means of high reflectivity of the reflection layer 12.

Figure 10:
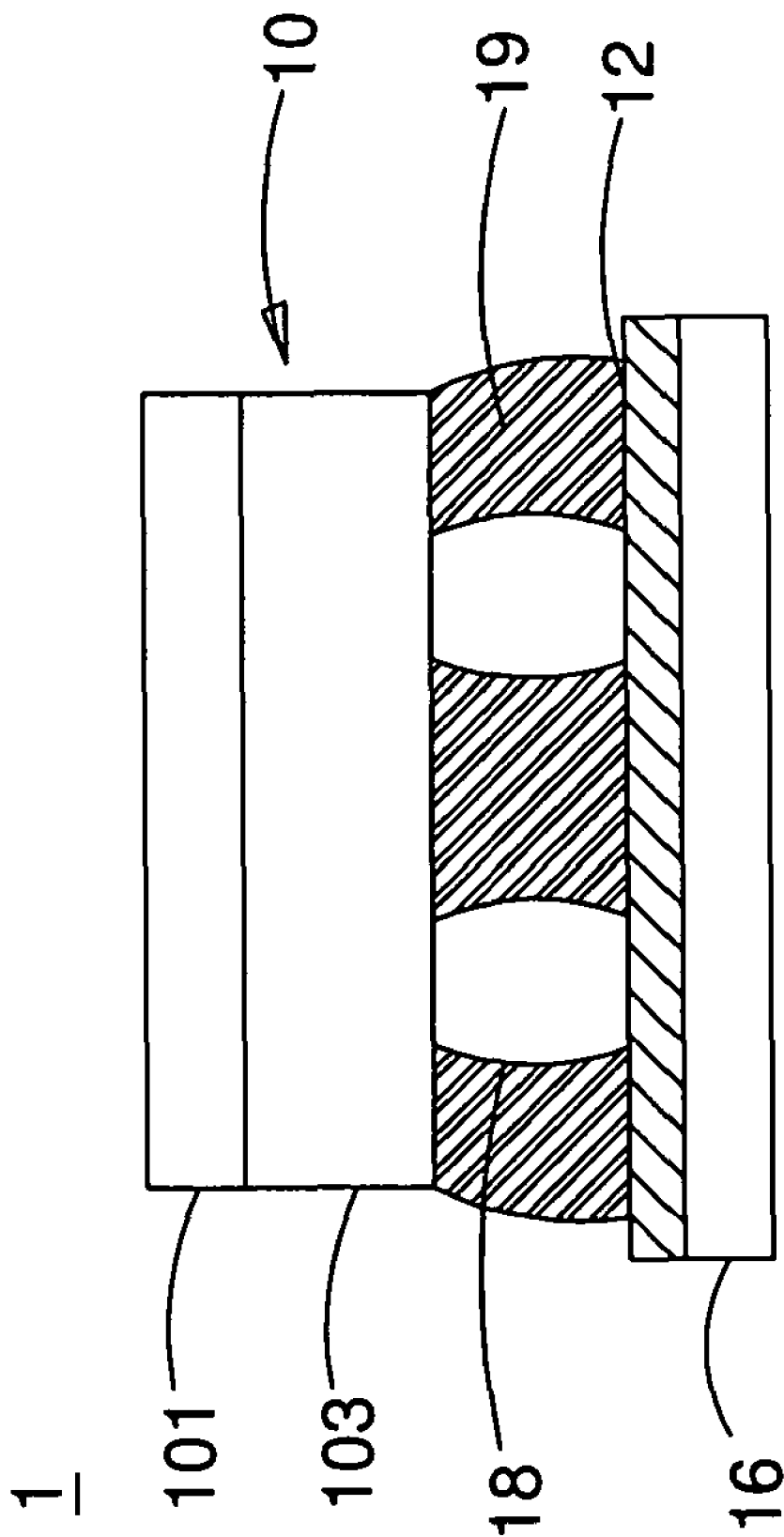
FIG. 10 shows a structural schematic diagram of the light-emitting device according to another preferred embodiment of the present invention.

FIG. 10 shows a structural schematic diagram of the light-emitting device according to another preferred embodiment of the present invention. As shown in the figure, the difference between the present preferred embodiment and the one in FIG. 9 is that, according to the present preferred embodiment, a supporting layer 19 is set between the platform 16 with the reflection layer 12 and the epitaxial structure 103 for supporting the LED 10. The material of the supporting layer 19 is organic polymers.

To sum up, the present invention provides a light-emitting device with a reflection layer and the structure of the reflection layer. The reflection layer comprises a variety of dielectric materials without metallic materials for reducing inter-diffusion phenomenon between the reflection layer and other metal layers. The reflection layer includes a plurality of dielectric layers. The materials of the plurality of dielectric layers have two or more types with two or more thicknesses for forming the reflection layer with a variety of structures. The reflection layer can reflect light a wide spectrum of light with high reflectivity. In addition, it can be applied to light-emitting diodes of various types to for new light-emitting devices with improved light-emitting efficiency.

Accordingly, the present invention conforms to the legal requirements owing to its novelty, non-obviousness, and utility. However, the foregoing description is only a preferred embodiment of the present invention, not used to limit the scope and range of the present invention. Those equivalent changes or modifications made according to the shape, structure, feature, or spirit described in the claims of the present invention are included in the appended claims of the present invention.

The invention claimed is:

1. A light-emitting device with a reflection layer, comprising:
    a light-emitting diode (LED) including a substrate and an epitaxial structure;
    a reflection layer, set on the LED, directly touching the substrate or the epitaxial structure, and comprising a plurality of dielectric layers; and
    the plurality of dielectric layers having two or more material types with two or more dielectric layer thicknesses, wherein the reflection layer reflects light of wide range of wavelengths in the spectrum of the light-emitting diode and the transmitivity of the reflection layer is less than 20%, and the thicknesses and materials of the dielectric layers are not arranged periodically.

2. The light-emitting device with a reflection layer of claim 1, wherein the thickness of the reflection layer is between 3000Å and 500000Å.

3. The light-emitting device with a reflection layer of claim 1, wherein the materials of two adjacent dielectric layers of the plurality of dielectric layers are different.

4. The light-emitting device with a reflection layer of claim 1, wherein one of the materials of the plurality of dielectric layers is selected from the group consisting of silicon oxide, titanium oxide, zinc oxide, niobium oxide, tantalum oxide, aluminum oxide, indium oxide, magnesium oxide, and tin oxide.

5. The light-emitting device with a reflection layer of claim 1, wherein one of the materials of the plurality of dielectric layers is selected from the group consisting of silicon nitride, titanium nitride, zinc nitride, niobium nitride, tantalum nitride, aluminum nitride, indium nitride, magnesium nitride, and tin nitride.

6. The light-emitting device with a reflection layer of claim 1, and further comprising a heat transfer layer, set on the reflection layer, and opposite to the LED.

7. The light-emitting device with a reflection layer of claim 6, wherein the reflection layer further has a plurality of heat transfer channels.

8. The light-emitting device with a reflection layer of claim 6, wherein the material of the heat transfer layer is selected from the group comprising gold-tin alloy, copper-tungsten alloy, and other metallic alloy with high heat transfer coefficients.

9. A light-emitting device with a reflection layer, comprising:
   a light-emitting diode (LED) including a substrate and an epitaxial structure;
   a reflection layer, set on the LED, directly contacting the substrate or the epitaxial structure and comprising a plurality of dielectric layers; and
   the plurality of dielectric layers having two or more material types with two or more dielectric layer thicknesses, wherein the materials of the dielectric layers are not arranged periodically.

10. A light-emitting device with a reflection layer, comprising:
   a light-emitting diode (LED) including a substrate and an epitaxial structure;
   a reflection layer, set on the LED, directly contacting the substrate or the epitaxial structure and comprising a plurality of dielectric layers; and
   the plurality of dielectric layers having two or more material types with two or more dielectric layer thicknesses, wherein the dielectric layer thicknesses of the dielectric layers are not arranged periodically.

* * * * *